United States Patent
Kim et al.

(10) Patent No.: US 9,291,681 B2
(45) Date of Patent: Mar. 22, 2016

(54) MONITORING APPARATUS AND METHOD OF BATTERY CONTACT POINT IN CHARGE/DISCHARGE SYSTEM WITH BATTERIES CONNECTED IN SERIES

(71) Applicants: LG CNS CO., LTD., Seoul (KR); HBL Corporation, Daejeon (KR)

(72) Inventors: Jeong Moog Kim, Seoul (KR); Hwan Hee Lee, Seoul (KR); Tae Hyoung Ryu, Seoul (KR); Dong Hoon Shin, Seoul (KR); Cheol Kyu Han, Seoul (KR)

(73) Assignees: LG CNS CO., LTD, Seoul (KR); HBL CORPORATION, Daejeon (KR)

( * ) Notice: Subject to any disclaimer, the term of this patent is extended or adjusted under 35 U.S.C. 154(b) by 133 days.

(21) Appl. No.: 14/278,819

(22) Filed: May 15, 2014

(65) Prior Publication Data

US 2014/0340092 A1    Nov. 20, 2014

(30) Foreign Application Priority Data

May 15, 2013    (KR) .................. 10-2013-0054980

(51) Int. Cl.
*G01N 27/416* (2006.01)
*G01R 31/36* (2006.01)
*G01R 27/20* (2006.01)

(52) U.S. Cl.
CPC .......... *G01R 31/3658* (2013.01); *G01R 27/205* (2013.01)

(58) Field of Classification Search
CPC .................................................. G01R 31/3662
USPC .......................................................... 324/430
See application file for complete search history.

(56) References Cited

U.S. PATENT DOCUMENTS

| 6,822,423 B2 * | 11/2004 | Yau .................. H02J 7/0018 320/122 |
| 2002/0180445 A1 * | 12/2002 | Bertness ............ G01R 31/3662 324/426 |
| 2012/0306448 A1 | 12/2012 | Lu et al. |

FOREIGN PATENT DOCUMENTS

| JP | 2003-132873 | 5/2003 |
| WO | 2011/072939 | 6/2011 |

OTHER PUBLICATIONS

Bose, et al., "Lessons Learned in Using OHMIC Techniques for Battery Monitoring," IEEE Jan. 2001, XP010532835, pp. 99-104.
European Patent Office Application Serial No. 14168354.0, Search Report dated Jul. 13, 2015, 8 pages.

* cited by examiner

*Primary Examiner* — Edward Tso
*Assistant Examiner* — Ahmed Omar
(74) *Attorney, Agent, or Firm* — Lee, Hong, Degerman, Kang & Waimey

(57) ABSTRACT

A monitoring apparatus and method of a battery contact point that autonomously measures contact resistances of a contact terminal for directly connecting a battery for charging/discharging and a circuit in a charge/discharge apparatus for charging/discharging a single secondary battery or a plurality of secondary batteries in series.

14 Claims, 4 Drawing Sheets

MONITORING APPARATUS AND METHOD OF BATTERY CONTACT POINT IN CHARGE/DISCHARGE SYSTEM WITH BATTERIES CONNECTED IN SERIES

CROSS-REFERENCE TO RELATED APPLICATIONS

Pursuant to 35 U.S.C. §119(a), this application claims the benefit of earlier filing date and right of priority to Korean Patent Application No. 10-2013-0054980, filed on May 15, 2013, the contents of which are hereby incorporated by reference.

BACKGROUND

1. Field of the Invention

The present invention relates to a monitoring apparatus and method of a battery contact point that autonomously measures contact resistances of a contact terminal for directly connecting a battery for charging/discharging and a circuit in a charge/discharge apparatus for charging/discharging a single secondary battery or a plurality of secondary batteries in a row.

2. Description of the Related Art

A contact terminal directly contacting a battery in a battery charging/discharging circuit may experience degradation in contactability due to various reasons such as extraneous substances and an oxide film forming on a metal surface over a period of time, thereby causing heat to be generated during a process of charging/discharging, and possibly causing a fire. Typically, a battery contact point is disposed at a position that is difficult to observe through unaided eyes, and noticing a change in a contact resistance is therefore usually quite difficult.

Conventional charge/discharge apparatuses for a secondary battery may determine a presence of an abnormality in a contact resistance by measuring an intrinsic voltage of a battery and a phase difference occurring at a contact point during charging/discharging. In this instance, the conventional charge/discharge apparatuses may further require an expensive precision voltage measuring circuit in order to measure the contact resistance, thus leading to an increase in cost and time.

In a conventional method of precisely measuring a contact resistance of a battery in a region in which the contact resistance is provided in a unit of milliohm (m$\Omega$), a battery is connected, a predetermined amount of current, typically within a range from a few amperes (A) to tens of A in which a m$\Omega$ resistance is measurable. Such measuring is often conducted during a relatively short period of time insufficient for heat to be generated, for example, typically for "0.01" to "1" second. An output voltage of a source device during the conducting may be compared to a voltage measured by a battery management system (BMS), and the contact resistance is calculated based on Ohm's law.

In this example, a voltage measuring instrument in an isolated type or a differential type structure is required to precisely measure the output voltage of the source device. Also, the conventional method may face difficulty in that a number of expensive precision measuring instruments corresponding to a number of batteries are required because a contact resistance of a battery contact point is in units of m$\Omega$ and a voltage of the battery contact point is merely in the range from a few mV to tens of mV. As a result, volume and weight of the voltage measuring instrument may increase and time and costs consumed for measuring may also increase correspondingly.

Korean Patent Publication No. 1997-0007366 discloses an apparatus and method of measuring a crimped terminal contact resistance. Technical configurations of the apparatus and method of measuring the crimped terminal contact resistance include measuring a contact resistance by flowing a large current between a crimped terminal and a conductor and measuring a voltage drop between the crimped terminal and an electric line, or measuring a calorie generated on a contact surface.

Korean Patent Publication No. 2000-0071372 discloses an apparatus and method of measuring an electric resistance of a circuit substrate. Technical configurations of the apparatus and method of measuring the electric resistance of the circuit substrate includes measuring an electric resistance applicable to a circuit substrate having an electrode in a small size or pitch using a current supplying electrode and a voltage measuring electrode.

SUMMARY

An aspect of the present invention, to be useful in a circuit for simultaneously charging/discharging by connecting a plurality of secondary batteries connected in series, is to measure on overall loop resistance of a charge/discharge system in advance, sequentially connect a plurality of batteries connected in series to a main power circuit, measure a contact resistance of a plurality of battery contact terminals, recognize a presence of an abnormality in the contact resistance prior to charging/discharging, and prevent accidents such as poor charging/discharging and fire outbreak.

Another aspect of the present invention is to prevent accidents by measuring a contact resistance of a battery prior to charging/discharging in an apparatus for simultaneously charging/discharging at a high direct current (DC) by connecting a plurality of secondary batteries, and easily recognize whether a battery contact point has a good or poor contact without an additional expensive measuring instrument with reference to an electric property of an individual battery obtained by a conventional battery management system (BMS) commonly used in a battery charge/discharge circuit.

Still another aspect of the present invention is to readily recognize a state of a battery contact point by increasing a DC voltage through a plurality of secondary batteries connected in series while a contact resistance is measured by conducting a predetermined large current and measuring a micro voltage because the contact resistance is typically within a range of a few m$\Omega$, for example, from 0.001$\Omega$ to 10 m$\Omega$, for each contact point.

According to an aspect of the present invention, there is provided a monitoring apparatus and method of a battery contact point that readily and rapidly measures a contact resistance of a battery contact point for electrically and/or mechanically contacting a plurality of batteries connected in series without an additional expensive measuring instrument with reference to an electric property of an individual battery obtained by a conventional isolated BMS commonly used in a battery charge/discharge circuit, in "a DC microgrid system that shares a higher DC power for charging/discharging than a single battery voltage by connecting a plurality of batteries in series" appropriate for a compact and light weight charge/discharge system and highly efficient power conversion of the charge/discharge system and a charge/discharge system having a single bi-directional DC<->DC converter and a constant current source.

According to another aspect of the present invention, there is provided a monitoring apparatus for a battery contact point, the apparatus including a measuring element to separate all batteries from a charge/discharge circuit, conduct a set current circuit during a predetermined period of time, measure an overall voltage of the charge/discharge circuit, and measure an overall loop resistance of the charge/discharge circuit based on Ohm's law, a measuring element to connect a first battery to the charge/discharge circuit, flow the set current during a predetermined period of time, and measure a contact resistance of a first battery circuit based on a degree of change in the overall voltage compared to an intrinsic voltage of a battery. The measuring element measures, in the same manner as above, contact resistances of all the batteries by sequentially connecting each battery to a circuit, in order to more easily and efficiently detect, in advance, a presence of an abnormality in a contact resistance in a charge/discharge system with a plurality of secondary batteries connected in series.

According to still another aspect of the present invention, there is provided a monitoring method of a battery contact point. The method including separating all batteries from a charge/discharge circuit, conducting a set current during a predetermined period of time, measuring an overall voltage of the charge/discharge circuit, and measuring a loop resistance of an overall circuit based on Ohm's law, connecting a first battery to the charge/discharge circuit, conducting the set current during a predetermined period of time, and measuring a contact resistance of a first battery circuit based on a degree of change in the overall voltage compared to an intrinsic voltage of a battery, and measuring, in the same manner as above, contact resistances of all the batteries by sequentially connecting each battery to a circuit, in order to more easily and efficiently detect, in advance, a presence of an abnormality in a contact resistance in a charge/discharge system with a plurality of secondary batteries connected in series.

According to embodiments of the present invention, it is possible to prevent accidents, reduce costs, and enhance productivity by recognizing a good or poor contact of a battery contact point in advance during a short period of time prior to charging/discharging without an additional precision measuring instrument, in a charge/discharge system with a plurality of secondary batteries connected in series. One technique to achieve this feature includes the contact resistance of a battery contact point being calculated prior to charging/discharging, where an event is indicated when the contact resistance of the battery contact falls below a threshold level of contact.

Additionally, according to embodiments of the present invention, it is possible to prevent secondary damage of an apparatus or major accidents such as a fire by not charging/discharging a battery of a poor battery contact point or informing an operator of an exchange for the poor battery contact point by automatically recognizing a state of a contact point of an individual battery for tens of seconds or a few minutes prior to charging/discharging.

Furthermore, according to embodiments of the present invention, it is possible to rapidly and precisely recognize a state of a battery contact point by increasing a DC voltage through a plurality of secondary batteries connected in series to measure a contact resistance of the battery contact point while the contact resistance is measured by conducting a predetermined large current and measuring a micro voltage because the contact resistance is typically within a range of a few mΩ, for example, from 0.001Ω to 10 mΩ, for each contact point.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION

Figure 1:
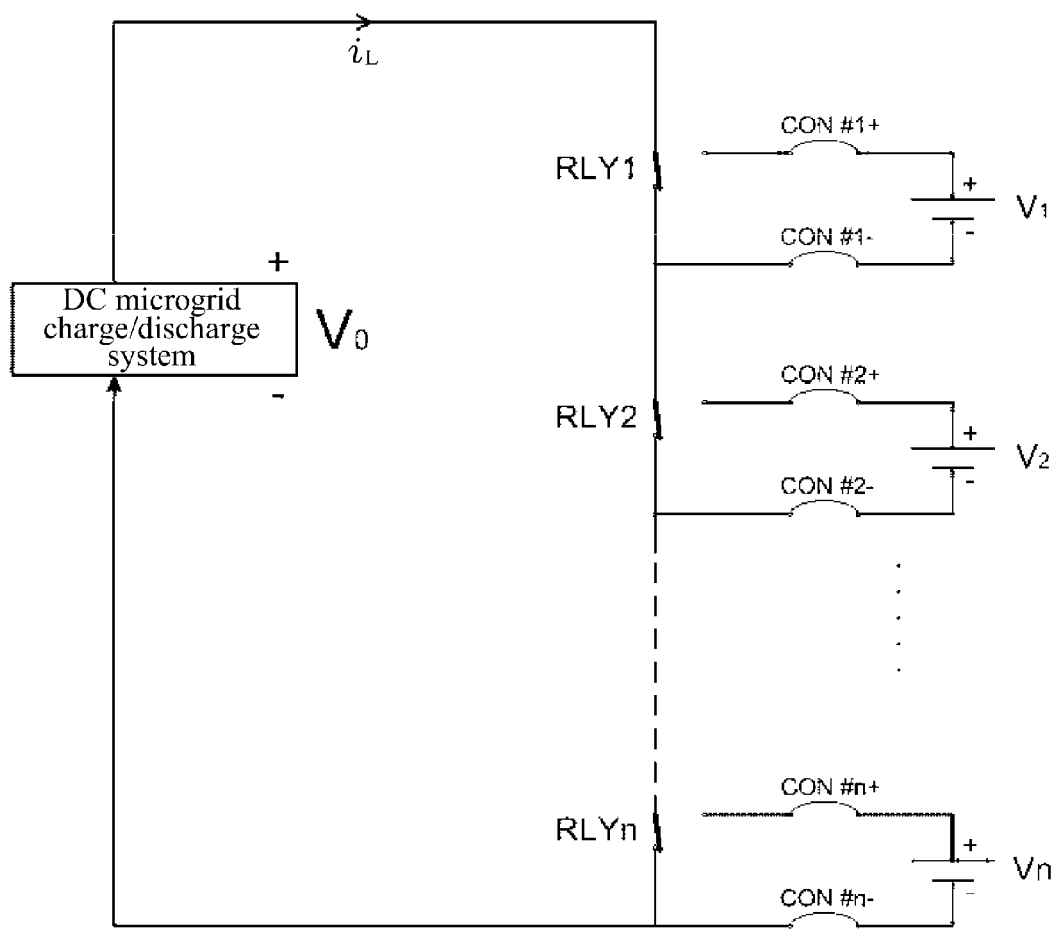
FIG. 1 is a diagram illustrating a circuit for measuring loop resistance of a battery contact point in a charge/discharge system with a plurality of batteries connected in series according to an embodiment of the present invention.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

Upon consideration of the noted deficiencies, for example, of conventional systems, assorted technical configurations of the present invention provide for recognizing a good or poor contact of a battery contact point in advance during a short period of time prior to charging/discharging, prevents accidents caused by a loose contact, and enhances productivity without an additional precision measuring instrument for measuring a contact resistance for a plurality of battery contact points in a charge/discharge system with a plurality of secondary batteries connected in series.

Moreover, technical configurations of the present invention provide for recognizing a good or poor contact of a battery contact point in advance during a short period of time prior to charging/discharging, preventing accidents caused by a loose contact, and enhancing productivity without an additional precision measuring instrument for measuring a contact resistance for a plurality of battery contact points in a charge/discharge system with a plurality of secondary batteries connected in series.

Embodiments of the present invention may also be directed to a method of rapidly and precisely measuring a state of a contact point of batteries connected in series by increasing a direct current (DC) through a plurality of secondary batteries connected series, and rapidly and precisely measuring a contact resistance typically within a range of a few milliohms (mΩ), for example, from 0.001Ω to 10 mΩ, for each contact point.

Further embodiments of the present invention are directed to preventing secondary damage of a charge/discharge apparatus and major accidents such as a fire, by rapidly measuring a contact resistance of a contact point for tens of seconds to a few minutes prior to charging/discharging a plurality of batteries, despite differing measurement times based on a number of batteries connected in series, and detecting a good or poor contact of the contact point. Various embodiments of the present invention will now be discussed in detail.

Embodiment 1

Embodiments of the present invention are described with reference to the drawings, and in particular, FIGS. 1-3. According to an aspect of the present invention, it is efficient and appropriate to apply the present invention to "a DC microgrid system that shares a significantly higher DC power for charging/discharging than a single battery voltage through a plurality of batteries connected in series" suitable for a compact and light weight charge/discharge system and highly efficient power conversion of the charge/discharge system, and a charge/discharge system having a single bi-directional DC<->DC converter or a charge/discharge system having a bi-directional DC<->DC converter and a bi-directional linear constant current source.

According to another aspect of the present invention, there is provided an apparatus including a measuring element to separate all batteries from a charge/discharge circuit, measure an overall voltage while conducting a set current to the charge/discharge circuit during a predetermined period of time, and measure an overall loop resistance of the charge/discharge circuit based on Ohm's law, and a measurer to connect a first battery to the charge/discharge circuit, flow the set current during a predetermined period of time, and measure a contact resistance based on a degree of change in the overall voltage compared to an intrinsic voltage of a battery.

An apparatus according to certain embodiments further includes a measuring element to sequentially connect a plurality of batteries to circuits, and measure contact resistances of battery contact points of all the batteries in the same manner as above.

Figure 2:
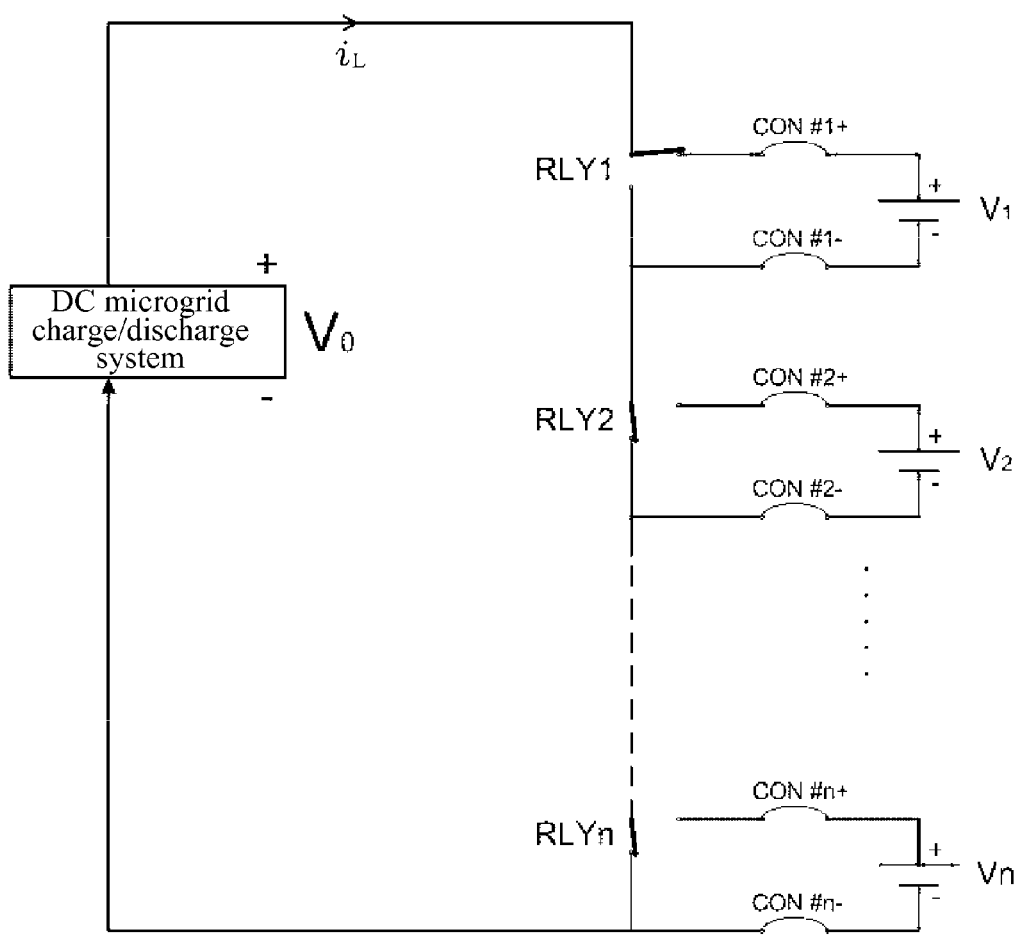
FIG. 2 is a diagram illustrating a circuit for measuring contact resistance of a first battery contact point in a charge/discharge system with a plurality of batteries connected in series according to an embodiment of the present invention.

The battery contact points correspond to CON#1+, CON#1−, CON#2+, CON#2−, CON#n+, and CON#n− of FIGS. 1 and 2.

Prior to describing technical configurations, a system to which the present invention is easily applicable will be discussed as an example.

Figure 3:
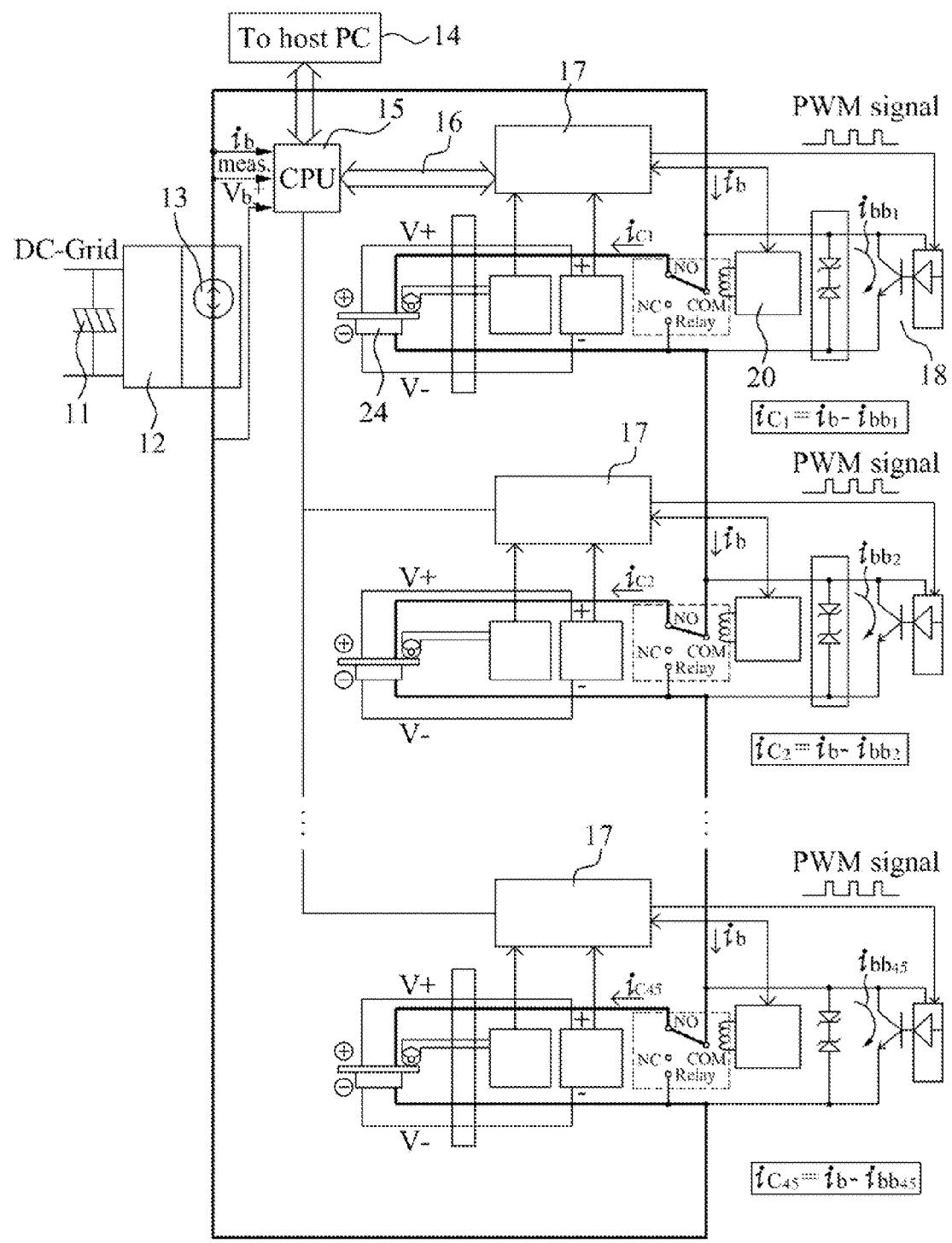
FIG. 3 is a diagram illustrating a DC microgrid charge/discharge system with a plurality of batteries connected in series according to an embodiment of the present invention.

FIG. 3 is a diagram illustrating a DC microgrid charge/discharge system with a plurality of batteries connected in series according to an embodiment of the present invention. A monitoring apparatus for a battery contact point may be applied to the DC microgrid charge/discharge system, such that a good or poor contact state of the battery contact point is rapidly detected prior to charging/discharging.

Figure 4:
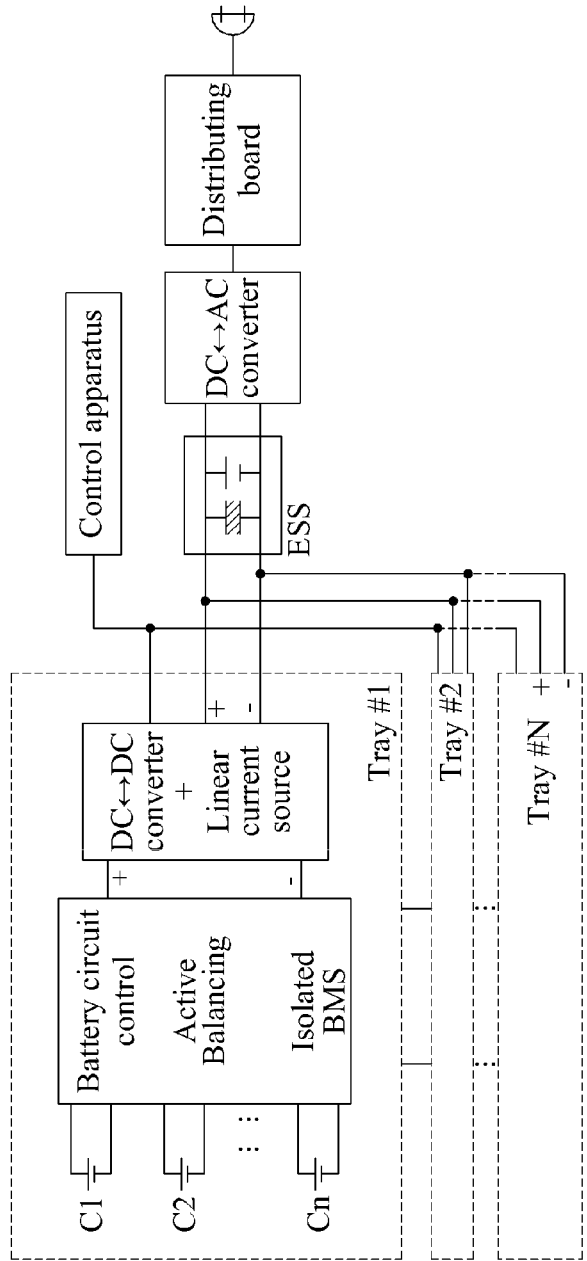
FIG. 4 illustrates an example of a system that implements the charge/discharge system of FIG. 3 according to an embodiment of the present invention.

FIG. 4 illustrates an example of a system that implements the charge/discharge system of FIG. 3. Overall technical configurations of the charge/discharge system will be described with reference to FIGS. 3 and 4.

FIG. 3 illustrates a DC microgrid charge/discharge system that may include the advantage of lower manufacturing costs, significantly less weight and size, and significantly less installation space than a conventional charge/discharge apparatus. In various examples described herein, the term "charge and discharge" is interchangeably used with the term "charge/discharge". The term "DC microgrid charge/discharge system" is interchangeably used with the "charge/discharge system" and the term "secondary battery" is interchangeably used with the term "battery", also referred to as a "lithium secondary battery".

Referring to FIG. 4, a commercial power source is input through a distributing board. The commercial power source supplied through the distributing board is stored in a DC energy storage system (ESS) through a bi-directional alternating current (AC)-to-DC (AC-DC) converter.

The DC ESS has a required voltage and capacity by connecting electrolytic condensers and/or super condensers in series or in parallel. Each of the electrolytic condensers and/or super condensers has a capacity of hundreds of faraday (F).

In this example, power is stored in the ESS in a DC state during discharging although charging and discharging may not concurrently occur necessarily. The power stored in the DC state is directly available for charging without a conversion loss.

Referring to FIG. 3, a power source output through a DC ESS 11 is generated as a bi-directional linear constant current source 13, for example, a linear current source, through a bidirectional DC-DC converter 12, thereby charging/discharging each secondary battery. The bidirectional DC-DC converter 12 is provided for each of the trays.

Although the bi-directional linear constant current source 13 has an advantageous effect of enhancing precision and stability during charging/discharging control, the bi-directional linear constant current source 13 may be omitted in consideration of manufacturing cost.

The bi-directional DC-DC converter 12 and the bi-directional linear constant current source 13 are provided for each of a plurality of trays of FIG. 4 in order to charge/discharge a plurality of batteries 24 of FIG. 3 connected in series.

Stable charging/discharging is made possible through use of the bi-directional linear constant current source 13 for the charging/discharging, irrespective of a number of secondary batteries 24 connected in series. For example, tens to hundreds of batteries 24 are efficiently charged/discharged, despite a voltage fluctuation that varies based on a number of the batteries 24 connected in series.

The DC microgrid charge/discharge system provides an advantageous effect of significantly reducing energy because energy conversion efficiency is increased to greater than 80% by converting a power through the plurality of batteries 24 connected in series and thereby increasing voltages at both ends of a battery row.

The DC microgrid charge/discharge system may be desirably configured to set an appropriate voltage for a charge/discharge system to be two times greater than a maximum voltage at both ends of the battery row connected in series in order to achieve optimum energy conversion efficiency and increase a resolution during power control. However, the appropriate voltage may be set in different manners, depending on a particular case.

A single tray includes a controller 17 and a microprocessor, for example, a central processing unit (CPU) 15 of FIG. 3. The controller 17 controls charging and discharging for each of the batteries 24 connected in series. The CPU 15 is connected to the controller 17 through a communicator 16 of FIG. 3 and controls the controller 17.

The controller 17 is configured to provide a sensor including a thermometer, a voltmeter, and an ammeter at required positions, and receive an input of a temperature and a voltage of a battery, for example, an open circuit voltage (OCV), and a current and a voltage of a circuit measured for each sensor in order to efficiently and stably charge/discharge each of the batteries 24 connected in series.

The DC microgrid charge/discharge system measures and uses $V_b$, ib, $ibb_1$ through $ibb_{45}$, a voltage between both ends of a battery, or a temperature of a battery as shown in FIG. 3 to efficiently control charging/discharging. For example, each of the batteries 24 is provided with, at both ends of the batteries 24, an isolated battery management system (BMS) configured to precisely measure a voltage, a current, and a temperature that indicate a state for each of the batteries 24 when the batteries 24 are isolated from one another.

A control program is loaded in a memory of the controller 17. The control program includes a unit configured to simultaneously charge and discharge the batteries 24 having differing capacities using the bi-directional linear constant current source 13 in an efficient manner.

The control program also includes a state monitor for a battery contact point configured to precisely and rapidly measure a contact resistance in an efficient manner.

The CPU 15 provided in each of the trays is connected to a control apparatus, for example, a host personal computer (PC) of FIG. 3, and is configured to exchange signals with the host PC 14 through a wired/wireless communicator.

A circuit for charging/discharging the DC microgrid charge/discharge system is indicated by a bold black line in FIG. 3, and it may be easily understood with reference to FIG. 3 that charging/discharging is performed while a constant current supplied from the bi-directional linear constant current source 13 passes through each of the batteries 24 connected in series.

The DC microgrid charge/discharge system is configured to control charging/discharging for each of the batteries 24 in the controller 17 because characteristics and capacities, for example, an internal resistance of a battery, differ for each of the batteries 24. For example, when a control range is high, charging/discharging is controlled by turning ON/OFF a relay in a constant current mode, and when a refined control is required, charging/discharging is controlled by operating an active balancing circuit 18 of FIG. 3 in a constant voltage mode.

Referring still to FIG. 3, a relay snubber is disposed at both ends of the relays. The relay snubber is configured to enhance durability of the relays and induce a stable operation of a circuit by preventing a disconnect in a current caused by opening the circuit when the relays move from one contact point to another contact point, and preventing damage on the contact point caused by a spark occurring when the contact point opens/closes.

For example, the relay snubber is directed to stably operate the circuit and enhance the durability of the relays by preventing the circuit opening and the damage on the contact point by bypassing a current when the relay opens.

Referring still to FIG. 3, a relay control unit 20 is provided for each of the batteries 24, and functions to control a current flowing to the batteries 24 by opening/closing the relays based on a control signal transmitted from the controller 17.

Embodiments previously described relate to a DC microgrid charge/discharge system configured to charge/discharge by connecting a plurality of batteries in series for rapidly detecting a state of a battery contact point through an application of the present invention.

The present invention may be easily applicable to the aforementioned DC microgrid charge/discharge system, and it would be appreciated by those skilled in the art that further changes in the state monitor of the battery contact point may be made to these exemplary embodiments without departing from the principles and spirit of the invention, the scope of which is defined by the claims and their equivalents.

The technical configurations of various embodiments will be described with reference to FIG. 1.

FIG. 1 illustrates technical configurations in which contact resistance is measured in the DC microgrid charge/discharge system of FIG. 3 by a monitoring apparatus for a battery contact point. The monitoring apparatus for the battery contact point operates under control of a controller using a voltage and a current measured by a sensor and a predetermined value stored in a memory.

A conventional method of measuring a contact resistance of a battery in a region in which the contact resistance is provided in a unit of mΩ includes connecting a plurality of batteries, conducting a predetermined current typically set within a range from a few amperes (A) to tens of A in which a mΩ contact resistance is measurable, during a relatively short period of time insufficient for heat to be generated, for example, typically for "0.01" to "1" second, comparing an output voltage of a charge/discharge system during the conducting to a voltage measured by a BMS, and calculating the contact resistance based on Ohm's law.

According to the conventional method, a voltage measuring instrument in an isolated type or a differential type structure is required to precisely measure the output voltage of a source device. In this example, the conventional method may face difficulty in that a number of expensive precision measuring instruments corresponding to a number of batteries are required to measure the output voltage because a contact resistance of a battery contact point is in the unit of mΩ and a voltage of the battery contact point is merely from a few mV to tens of mV. As a result, a volume and a weight of the voltage measuring instrument may increase and a time and a cost consumed for measuring may also increase correspondingly.

A unit actually connected to the plurality of secondary batteries corresponds to the battery contact point, and recognizing a contact resistance of the battery contact point is one of the technical issues of the present invention needed to be addressed.

The isolated BMS, being connected to the battery contact point for the plurality of secondary batteries, precisely measures the battery voltage and is used in any charge/discharge apparatus.

According to the illustrated embodiment, it is possible to prevent secondary damage of an apparatus or major accidents such as a fire by not charging/discharging a battery of a poor battery contact point or repairing the battery by informing an operator through a monitor interworking with a communicator or a host computer by automatically recognizing a state of a contact point of an individual battery within tens of seconds or a few minutes prior to charging/discharging.

Additionally, it is possible to readily recognize a state of a battery contact point by increasing a DC voltage through a plurality of secondary batteries connected in series while a contact resistance is measured by conducting a predetermined large current and measuring a micro voltage because the contact resistance is typically within a range of a few mΩ, for example, from 0.001Ω to 10 mΩ, for each contact point.

The output voltage Vb of the DC microgrid charge/discharge system is measured by an additional output voltage detection sensor in real time.

A single output voltage detection sensor may suffice to simultaneously charge/discharge a plurality of batteries because a single bi-directional linear constant current source is provided as shown in FIG. 3.

Vb of FIG. 3 corresponds to the output value $V_0$ of the DC microgrid charge/discharge system of FIG. 1.

Descriptions pertaining to the technical configurations of measuring the contact resistance of the battery contact point in the monitoring apparatus for the battery contact point according to embodiments of the present invention will be discussed in further detail.

The monitoring apparatus for the battery contact point includes a measuring element to separate all batteries connected in series from a battery charge/discharge control circuit by operating relays, conduct a set current to a memory of a controller, and measure a loop resistance $Z_0$ of the battery charge/discharge control circuit exclusive of a battery contact point.

For example, the monitoring apparatus for the battery contact point in the DC microgrid charge/discharge system for charging/discharging the plurality of batteries connected in series separates all the batteries connected in series from the battery charge/discharge control circuit prior to charging/discharging by operating the relays as shown in FIG. 3, conducts the set current easily recognizable within a m$\Omega$ region, for example, 20 A, during a predetermined period of minimum measurement time, for example, one second, and measures the loop resistance $Z_0$ of the battery charge/discharge control circuit exclusive of the battery contact point to store in the memory. The loop resistance $Z_0$ is calculated by Equation 1 where $Z_0=V_0$/conducting current (20 A).

Loop resistance ($Z_0$)=output voltage ($V_0$) of charge/discharge system/conducting current  Equation 1:

In this example, the battery charge/discharge control circuit refers to a control circuit including an electric element to be used for charging/discharging the aforementioned plurality of batteries, and a connected circuit for charging/discharging the plurality of batteries connected in series as shown in FIG. 3.

Referring to FIG. 1, the monitoring apparatus for the battery contact point includes a measuring element to connect a first battery to the battery charge/discharge control circuit by operating the relays used for charging the first battery, conducting the set current, for example, 20 A, during a predetermined period of time, and measure the output voltage Vb of the DC microgrid charge/discharge system measured during the conducting and a battery voltage recognized by the isolated BMS provided in a first battery contact point.

A contact resistance of the first battery contact point is calculated based on Equation 2 using the measured output voltage of the charge/discharge system and the recognized first battery voltage.

Contact resistance of first battery contact point=(measured output voltage of charge/discharge system−first battery voltage)/conducting current (20 A)−loop resistance $Z_0$×(number of all batteries)−1)/(number of all batteries)  Equation 2:

A value obtained based on Equation 2 is the contact resistance of the first battery contact point.

"Number of all batteries" in Equation 2 denotes a sum of all the batteries connected in series in a single tray.

The monitoring apparatus for the battery contact point includes a measuring element to connect a second battery to the battery charge/discharge control circuit by operating the relays connected to the second battery, conduct the set current, for example, 20 A, during a predetermined period of time, and measure the output voltage Vb of the DC microgrid charge/discharge system measured during the conducting and a second battery voltage recognized in an isolated BMS provided in a second battery contact point.

A contact resistance of the second battery contact point is calculated based on Equation 3 using the measured output voltage of the charge/discharge system and the recognized second battery voltage.

Contact resistance of second battery contact point= (measured output voltage of charge/discharge system−second battery voltage)/conducting current (20 A)−loop resistance $Z_0$×(number of all batteries)−1)/(number of all batteries)  Equation 3:

A value obtained based on Equation 3 is the contact resistance of the second battery contact point.

The monitoring apparatus for the battery contact point includes a measuring element to connect an n-th battery to the battery charge/discharge control circuit by operating the relays connected to the n-th battery, conduct the set current, for example, 20 A, during a predetermined period of time, and measure the output voltage Vb of the DC microgrid charge/discharge system measured during the conducting and an n-th battery voltage recognized in an isolated BMS provided in an n-th battery contact point.

The set current "20 A" is merely given as an example, and a greater or nominal change may be made to a value of the set current.

A contact resistance of the n-th battery contact point is calculated for monitoring based on Equation (n) using the measured output voltage of the charge/discharge system and the recognized n-th battery voltage.

Contact resistance of $n$-th battery contact point=(measured output voltage of charge/discharge system−$n$-th battery voltage)/conducting current (20 A)−loop resistance $Z_0$×(number of all batteries)−1)/(number of all batteries)  Equation (n):

A value obtained based on Equation (n) is the contact resistance of the n-th battery contact point.

Consequently, contact resistances of all the batteries connected in series present in a single tray are measured.

A time consumed for measuring the contact resistance of the battery contact point is shorter than an entire charge/discharge time to a negligible extent.

When the monitoring apparatus for the battery contact point according to embodiments of the present invention is applied to the DC microgrid charge/discharge system of FIG. 3, the contact resistance of the battery contact point is rapidly and precisely measured within tens of seconds to a few minutes, despite differences based on a number of batteries connected in series.

Typically, a few hours may be consumed to completely end a contact resistance of a secondary battery contact point in the conventional charge/discharge system with secondary batteries although a time consumed to end the contact resistance varies based on charging/discharging recipes.

Embodiment 2

Embodiment 2 relates to a monitoring method of a battery contact point. The monitoring method of the battery contact point according to Embodiment 2 includes measuring a contact resistance of a battery contact point using the monitoring apparatus for the battery contact point previously described in Embodiment 1. Technical configurations of the monitoring method of the battery contact point according to Embodiment 2 will be described in detail.

The monitoring method of the battery contact point according to Embodiment 2 includes separating all batteries connected in series from a battery charge/discharge control circuit by operating relays.

Subsequent to the separating of all the batteries from the battery charge/discharge control circuit by operating the relays, a set current is conducted during a predetermined period of time, an output voltage Vb of a DC microgrid charge/discharge system measured during the conducting is divided by the conducting current, and a loop resistance of the battery charge/discharge control circuit is measured, exclusive of the battery contact point.

For example, all the batteries are separated from the battery charge/discharge control circuit using the relays prior to charging/discharging, the set current readily distinguishable in a m$\Omega$ region, for example, 20 A, is conducted during a predetermined period of minimum measurement time, for example, one second, an output voltage of the DC microgrid charge/discharge system is divided during the conducting by the conducting current, and the loop resistance $Z_0$ is measured. The loop resistance $Z_0$ is represented by Equation 5 where $Z_0=V_0$/conducting current (20 A).

The above configuration is identical to Equation 1 of Embodiment 1. In this example, the battery charge/discharge control circuit refers to a control circuit to be used for charging/discharging the aforementioned plurality of batteries connected in series, and a connected circuit for charging/discharging the plurality of batteries connected in series in FIG. 3.

The monitoring method of the battery contact point includes connecting the first battery to the battery charge/discharge control circuit by operating the relays connected to the first battery, conducting the set current, for example, 20 A, during a predetermined period of time, and measuring the output voltage Vb of the DC microgrid charge/discharge system measured during the conducting and a battery voltage recognized by an isolated BMS provided in a first battery contact point.

A contact resistance of the first battery contact point is calculated based on Equation 2 using the measured output voltage of the charge/discharge system and the recognized first battery voltage.

The above configuration is identical to Equation 2 of Embodiment 1. A value obtained based on Equation 2 is the contact resistance of the first battery contact point.

The monitoring method of the battery contact point includes connecting a second battery to the battery charge/discharge control circuit, conducting the set current, for example, 20 A, during a predetermined period of time, and measuring the output voltage Vb of the DC microgrid charge/discharge system measured during the conducting and the second battery voltage recognized in the isolated BMS provided in the second battery contact point.

A contact resistance of the second battery contact point is calculated based on Equation 3 using the measured output voltage of the charge/discharge system and the recognized second battery voltage.

The above configuration is identical to Equation 3 of Embodiment 1. A value obtained based on Equation 3 is the contact resistance of the second battery contact point.

The monitoring method of the battery contact point includes connecting an n-th battery to the battery charge/discharge control circuit by operating the relays connected to the n-th battery, conducting the set current, for example, 20 A, during a predetermined period of time, and measuring the output voltage Vb of the DC microgrid charge/discharge system measured during the conducting and the n-th battery voltage recognized in the isolated BMS provided in the n-th battery contact point.

A contact resistance of the n-th battery contact point is calculated based on Equation (n) using the measured output voltage of the charge/discharge system and the recognized n-th battery voltage.

The above configuration is identical to Equation (n) of Embodiment 1. A value obtained based on Equation (n) is the contact resistance of the n-th battery contact point. Consequently, contact resistances of all the batteries connected in series present in a single tray are measured.

A time consumed for measuring the contact resistance of the battery contact point is shorter than an entire charge/discharge time to a negligible extent.

When the monitoring method of the battery contact point according to embodiments of the present invention is applied to the DC microgrid charge/discharge system of FIG. 3, the contact resistance of the battery contact point is rapidly and precisely measured within tens of seconds to a few minutes, despite differences based on a number of batteries connected in series.

Typically, a few hours may be consumed to completely end a contact resistance of a secondary battery contact point in the conventional charge/discharge system of secondary batteries although a time consumed to end the contact resistance varies based on charging/discharging recipes.

Embodiments of the present invention may provide a monitoring apparatus and method of a battery contact point that autonomously measures contact resistances of a contact terminal for directly connecting a battery and a circuit in a charge/discharge apparatus for charging/discharging a single secondary battery or a plurality of secondary batteries in a row. The monitoring apparatus and method of the battery contact point according to embodiments of the present invention may provide a high industrial applicability by rapidly and precisely measuring a contact resistance using a measurement sensor for measuring a voltage and a current used for charging/discharging in a DC microgrid charge/discharge system prior to charging/discharging.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A monitoring apparatus, comprising:
    a measuring element configured to:
        separate a plurality of batteries connected in series from a battery charge/discharge control circuit by operating relays connected to the plurality of batteries, and
        measure a loop resistance of the battery charge/discharge control circuit, exclusive of a battery contact point, using an output voltage and a conducting current of a charge/discharge system while conducting a set current during a period of time; and
    a calculator configured to:
        connect a first battery, among the plurality of batteries, to the battery charge/discharge control circuit by operating a first relay, among the relays, provided for charging/discharging of the first battery,
        conduct the set current during the period of time,
        obtain the output voltage of the charge/discharge system measured during the conducting of the set current,
        obtain a first battery voltage measured by an isolated battery management system (BMS) provided in a first battery contact point of the first battery, and
        calculate a contact resistance of the first battery contact point using the measured loop resistance, the output voltage, and the first battery voltage.

2. The monitoring apparatus of claim 1, further comprising: a second calculator configured to:
    obtain a battery voltage, of each remaining battery of the plurality of batteries, as measured by an isolated battery management system (BMS) provided in a battery contact point of an associated battery of the remaining batteries, and
    calculate a contact resistance of a battery contact point of each of the remaining batteries using the measured loop resistance, the output voltage, and the battery voltage of an associated battery of the remaining batteries, connect a final n-th battery to the battery charge/discharge control circuit by operating a relay provided for charging/discharging the n-th battery, obtain an n-th battery voltage measured by an isolated BMS provided in an n-th battery contact point of the n-th battery, and calculate a contact resistance of the n-th battery contact point using the measured loop resistance, the output voltage, and the n-th battery voltage.

3. The monitoring apparatus of claim 2, wherein the contact resistance of the n-th battery contact point is represented by Equation (n), which is as follows:

{Contact resistance of $n$-th battery contact point= (measured output voltage of the charge/discharge system−the $n$-th battery voltage)/the conducting current−the loop resistance ($Z_0$)×(number of all the batteries−1)/(number of all the batteries)}.

4. The monitoring apparatus of claim 1, wherein the loop resistance is obtained by dividing the output voltage of the charge/discharge system by the conducting current of the charge/discharge system.

5. The monitoring apparatus of claim 1, wherein the contact resistance of the first battery contact point is represented by Equation 2, which is as follows:

{Contact resistance of first battery contact point= (measured output voltage of the charge/discharge system−the first battery voltage)/the conducting current−the loop resistance ($Z_0$)×(number of all the batteries−1)/(number of all the batteries)}.

6. The monitoring apparatus of claim 1, wherein a direct current (DC) is increased by connecting a plurality of secondary batteries connected in series, and the contact resistance for each of the plurality of battery contact points is measured in order to recognize a state of the battery contact points.

7. The monitoring apparatus of claim 1, wherein the contact resistance of the first battery contact point is calculated prior to charging/discharging, and wherein an event is indicated when the contact resistance of the first battery contact falls below a threshold level of contact.

8. A monitoring method comprising:

separating a plurality of batteries connected in series from a battery charge/discharge control circuit by operating relays connected to the plurality of batteries;

measuring a loop resistance of the battery charge/discharge control circuit, exclusive of a battery contact point, using an output voltage and a conducting current of a charge/discharge system while conducting a set current during a period of time;

connecting a first battery, among the plurality of batteries, to the battery charge/discharge control circuit by operating a first relay, among the relays, provided for charging/discharging of the first battery;

conducting the set current during the period of time;

obtaining the output voltage of the charge/discharge system measured during the conducting of the set current;

obtaining a first battery voltage measured by an isolated battery management system (BMS) provided in a first battery contact point of the first battery; and calculate a contact resistance of the first battery contact point using the measured loop resistance, the output voltage, and the first battery voltage.

9. The method of claim 1, further comprising:

obtaining a battery voltage, of each remaining battery of the plurality of batteries, as measured by an isolated battery management system (BMS) provided in a battery contact point of an associated battery of the remaining batteries;

calculating a contact resistance of a battery contact point of each of the remaining batteries using the measured loop resistance, the output voltage, and the battery voltage of an associated battery of the remaining batteries;

connecting a final n-th battery to the battery charge/discharge control circuit by operating a relay provided for charging/discharging the n-th battery;

obtaining an n-th battery voltage measured by an isolated BMS provided in an n-th battery contact point of the n-th battery; and calculating a contact resistance of the n-th battery contact point using the measured loop resistance, the output voltage, and the n-th battery voltage.

10. The method of claim 9, wherein the contact resistance of the n-th battery contact point is represented by Equation (n), which is as follows:

{Contact resistance of $n$-th battery contact point= (measured output voltage of the charge/discharge system−the $n$-th battery voltage)/the conducting current−the loop resistance ($Z_0$)×number of all the batteries−1)/(number of all the batteries)}.

11. The method of claim 9, wherein the loop resistance is obtained by dividing the output voltage of the charge/discharge system by the conducting current of the charge/discharge system.

12. The method of claim 9, wherein the contact resistance of the first battery contact point is represented by Equation 2, which is as follows:

{Contact resistance of first battery contact point= (measured output voltage of the charge/discharge system−the first battery voltage)/the conducting current−the loop resistance ($Z_0$)×(number of all the batteries−1)/(number of all the batteries)}.

13. The method of claim 9, wherein a direct current (DC) is increased by connecting a plurality of secondary batteries connected in series, and the contact resistance for each of the plurality of battery contact points is measured in order to recognize a state of the battery contact points.

14. The method of claim 9, wherein the contact resistance of the first battery contact point is calculated prior to charging/discharging, and wherein an event is indicated when the contact resistance of the first battery contact falls below a threshold level of contact.

* * * * *